United States Patent [19]

Belanger, Jr.

[11] Patent Number: 4,797,784

[45] Date of Patent: Jan. 10, 1989

[54] SUBSTRATE MOUNTING DEVICE

[75] Inventor: Thomas D. Belanger, Jr., Clarendon Hills, Ill.

[73] Assignee: GTE Communication Systems Corporation, Phoenix, Ariz.

[21] Appl. No.: 101,893

[22] Filed: Sep. 28, 1987

Related U.S. Application Data

[63] Continuation-in-part of Ser. No. 32,667, Apr. 1, 1987, abandoned.

[51] Int. Cl.⁴ .............................................. H05K 1/18
[52] U.S. Cl. ...................................... 361/395; 211/41; 361/399; 361/413; 361/415
[58] Field of Search ............... 361/412, 413, 415, 399, 361/394, 395, 419, 414; 211/41; 312/185, 187, 192, 323

[56] References Cited

U.S. PATENT DOCUMENTS

| | | | |
|---|---|---|---|
| 3,845,359 | 10/1974 | Fedele | 211/41 X |
| 4,019,099 | 4/1977 | Calabro | 211/41 X |
| 4,354,770 | 10/1982 | Block | 361/415 X |
| 4,382,517 | 5/1983 | Welsch | 211/41 |
| 4,532,576 | 7/1985 | Reimer | 211/41 X |
| 4,573,104 | 2/1986 | Kamada | 361/399 |

OTHER PUBLICATIONS

Taurus, Circuitrak printed circuit board holders pamphlet, pp. 1 to 7.

Primary Examiner—R. R. Kucia
Attorney, Agent, or Firm—Anthony Miologos

[57] ABSTRACT

A substrate mounting device for installing an electrical substrate to a carrier substrate. The substrate mounting device includes a plurality of guide rails mounted on the perimeter edge of the electrical substrate. First and second substrate guides are mounted to the carrier substrate in a spaced and parallel relationship to the other. Each substrate guide includes a channel extending longitudinally along a substrate guide inner side, from an open end to a top guide. The channel is further defined by a top surface and a plurality of drop guides which in turn form a plurality of slots. The electrical substrate is installed by manually inserting the electrical substrate into respective substrate guide open ends and manually pushing the electrical substrate along the channels until the substrate encounters a respective top guide. The top guides then urge the substrate downward until each electrical substrate guide rail falls into a respective substrate guide slot thereby, resting each of the electrical substrate's plurality of guide rails on the carrier substrate.

8 Claims, 2 Drawing Sheets

SUBSTRATE MOUNTING DEVICE

BACKGROUND OF THE INVENTION

This is a continuation-in-part of application 07/032,667 filed Apr. 1, 1987 now abandoned.

This invention relates in general to modular electronic circuit devices and more particularly to a device for mounting electrical substrates to a carrier substrate.

In the past few years, the use of plug-in units for electrical components has found favor within the electronics industry. Such plug-in units generally comprise a structure upon which are mounted electrical assemblies or sub-assemblies, the structure being arranged to be plugged in a suitable socket provided on a base chassis. When so plugged the components carried by the plug-in unit are electrically connected in proper circuit relation to other electrical equipment carried by the base chassis.

Recently however, with the coming of film circuits, the need for a specialized carrier structure for housing the sub-assembly has disappeared. This is mainly due to the smaller size of a film circuit. Compared to circuit fashioned in discrete components the film circuit is appreciably smaller and lighter. It is not uncommon to have film circuits plugged directly into larger circuit cards or other carrier substrates and in turn the larger substrate plugged into the base chassis. At present, most installations of film circuits to circuit cards is done as a permanent installation. Therefore, removal and replacement of the film circuits though not impossible, is a tedious and labor intensive job.

It therefore is an object of the present invention to disclose a new structure for mounting, electronic substrates onto carrier substrates.

SUMMARY OF THE INVENTION

In accomplishing the object of the present invention there is provided a substrate mounting device for mounting an electrical substrate to a carrier substrate. The electrical substrate of the present invention includes a first pair of guide rails each mounted on the perimeter edge of the electrical substrate directly opposite the other. A second pair of guide rails located in a spaced relationship from the first pair of guide rails are also mounted on the perimeter edge of the electrical substrate directly opposite the other.

First and second substrate guides are mounted to the carrier substrate in a spaced and parallel relationship to the other. Each of the first and second substrate guides include a channel extending longitudinally along a first side thereof, from an open end to a top guide. The channel is further defined by a top surface and first and second drop guides. The first and second drop guides further define first and second slots.

The electrical substrate is mounted to the substrate guides by manually inserting the electrical substrate into respective first and second substrate guide channels open ends and manually pushing the electrical substrate along the channels. The electrical substrate and first and second pairs of guide rails ride between respective first and second drop guides and top surfaces. When the substrate encounters the first and second top guides each respective top guide urges the electrical substrate downward. The first guide rail and the second guide rail then fall within respective first and second slots on each of the first and second substrate guides thereby, resting each of the first and second electrical substrate guide rails on the carrier substrate.

The electrical substrate can be provided with some means of electrical connection device which would contact or mate with similar devices mounted on carrier the substrate. This could provide for electrical connections between the electrical substrate and the carrier substrate.

BRIEF DESCRIPTION OF THE DRAWINGS

A better understanding of the invention may be had from the consideration of the following detailed description taken in conjunction with the accompanying drawing in which.

DESCRIPTION OF THE PREFERRED EMBODIMENT

Figure 1:
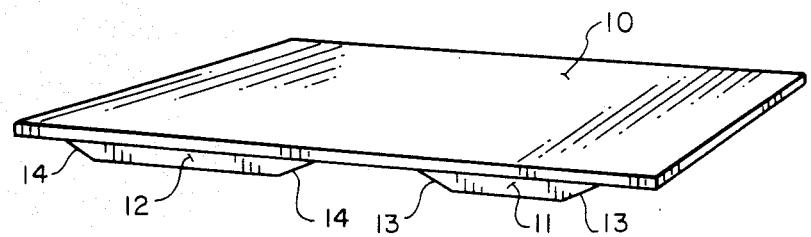
FIG. 1 is a perspective view of a substrate having the guide rails of the present invention installed thereon.
Figure 2:
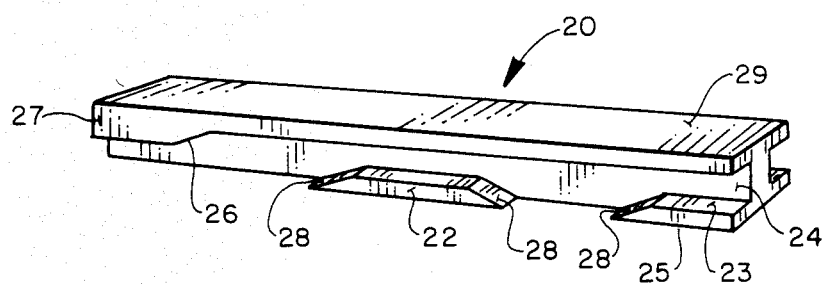
FIG. 2 is a perspective view of a substrate guide of the present invention.

Turning now to FIGS. 1 and 2 of the included drawings the device in accordance with the invention includes a planar substrate 10 having forward guide rails 11 and rear guard rails 12 attached or molded onto the substrate 10 along the edge of one of the substrates 10 major sides. A similar set of guide rails (not shown) is also positioned on the opposite major side of the substrate. As can be seen each guard rail end 13 and 14 is angled so as to aid insertion and extraction when installed into guide 20 of Fig.2.

Guide 20 is a integrally molded unit comprised of a slot or channel 24 extending longitudinally along an inner side of guide 20. Channel 24 is defined between a planar top cap or surface 29 and a rear drop guide 22 and forward drop guide 23. Additionally, the channel 24 extends from an opening at the forward end of the guide 20 to a top guide 27 at the rear of the guide 20. Both the forward and rear drop guides include ramped ends 28 to aid in the positioning and removal of the substrate 10. Further, the top guide 27 includes an angled surface 26 which also aids in the installation of substrate 10 and which will be explained in detail later. Finally, guide 20 includes a generally planar bottom surface 25 for mounting the guide to a carrier substrate.

Figure 3:
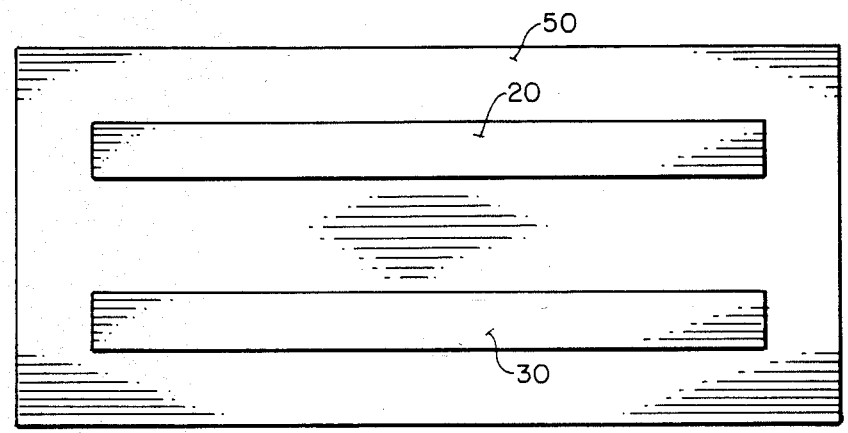
FIG. 3 is a top plan view of the substrate mounting device of the present invention mounted on a carrier substrate.

A pair of guides 20 and 30 form the substrate mounting device of the present invention shown in FIG. 3. Guide 30 is a mirror image in structure to guide 20.

The substrate mounting device of the present invention is attached by any convenient means to the top surface of a carrier substrate 50 such as a circuit card, backplane, or other electrical substrate.

Turning now to FIGS. 4-7 an explanation of the installation of the substrate 10 within the substrate mounting device of the present invention will be explained in detail. It should be noted that FIGS. 4-7 show the installation in sectional view and therefore only guide 20 is shown. It will be appreciated by those skilled in the art that an identical insertion procedure occurs simultaneously in guide 30 as the substrate is installed.

Figure 4:
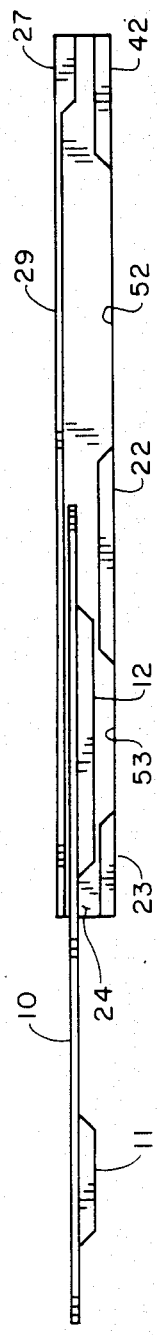
FIGS. 4-7 are sectional views of the substrate mounting device of the present invention illustrating the manner in which a substrate is installed.

Beginning at FIG. 4 the substrate 10 including rear guide rail 12 and forward guard rail 11 is inserted into channel 24 of guide 20 and pushed forward within the guide. As can be seen the real rail 12 rides within the channel between the forward drop guide 23, rear drop guide 22 and the top cap 29. The rear guide rail 12 being longer than the rear slot 53, which is defined by the rear drop guide 22 and forward drop guide 23, rides over the forward slot 53 on insertion.

Figure 5:
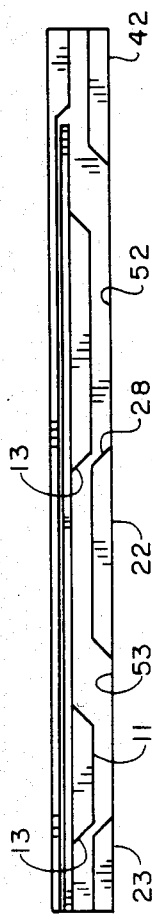

As the substrate 10 is installed further into guide 20 substrate guide rail 11 and 12 fall into slots 53 and 52 respectively, as illustrated in FIG. 5. This is aided by angled surfaces 13 of guide rails 11 and 12 sliding down angled surfaces 28 of drop guides 23 and 22.

Figure 6:
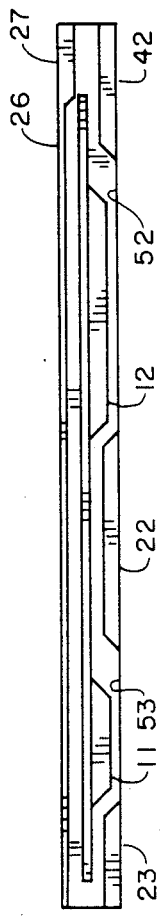
Figure 7:
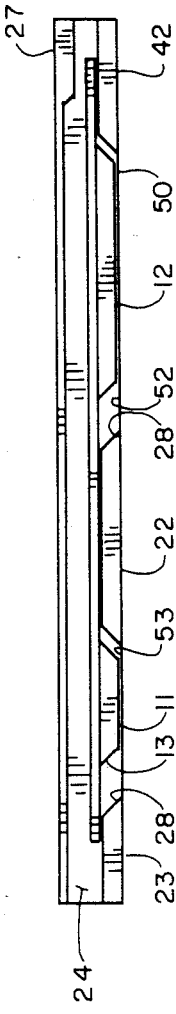

Angled surface 26 of top guide 27 insures that substrate 10 follows a downward motion as it is further pushed within the guide as shown in FIG. 6.

Finally, the substrate is fully installed when the forward rail 12 and rear rail 11 rest on the carrier substrate 50 top surface within respective slots 52 and 53. The forward end of substrate 10 rests on a top surface of bottom member 42 when fully installed.

It will be appreciated by those skilled in the art that the substrate 10 can be provided with some means of electrical connection devices which would contact or mate with similar devices mounted on carrier substrate 50. This would provide electrical connection between substrate 10 and the carrier substrate 50.

The substrate is easily removed by pulling the substrate 10 out of the guide 20 in an opposite direction to that of installation. A lifting action is provided by angled ends 13 of substrate rails 11 and 12 riding on angled ends 28 of drop guides 23 and 22. Once the substrate 10 and rails 11 and 12 are within channel 24 the substrate is pulled and withdrawn from the guide.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A substrate mounting device for mounting an electrical substrate to a carrier substrate comprising:
   a first pair of guide rails each mounted on the perimeter edge of said electrical substrate directly opposite each other;
   a second pair of guide rails located in a spaced relationship to said first pair of guide rails and each guide rail of said second pair of guide rails mounted on the perimeter edge of said electrical substrate directly opposite each other;
   first and second substrate guides mounted to said carrier substrate in a spaced and parallel relationship to each other, each of said substrate guides including a channel longitudinally oriented along a first side thereof, and each of said channels including an open end and a top guide, and each channel extends between said open end and said top guide, said first and second substrate guide channels further defined by a top surface and first and second drop guides, said first and second drop guides located opposite said top surface, and said first and second drop guides further defining first and second guide rail receiving slots;
   said electrical substrate and said first and second guide rails arranged to be manually inserted into respective first and second substrate guide channels at respective channel open ends and manually pushed along said channels riding between respective first and second drop guides and channel top surfaces until said substrate encounters a respective top guide whereby, said first guide rail and said second guide rail fall within respective first and second guide rail receiving slots on each of said first and second substrate guides, resting each of said first and second electrical substrate guide rails on said carrier substrate.

2. A substrate connector guide for mounting and electrically connecting an electrical substrate to a carrier substrate comprising:
   first rail means mounted on a first perimeter edge of said electrical substrate;
   second rail means mounted on a second perimeter edge of said electrical substrate directly opposite said first rail means;
   first and second guide means mounted to said carrier substrate in a spaced and parallel relationship to each other, each of said guide means including a channel extending longitudinally along a first side thereof and said channel extends between an open end and a terminating end, each channel including at least one rail means accepting slot; and,
   said electrical substrate and said first and second rails means arranged to be manually inserted into respective first and second substrate guide means channels at respective channel open ends and urged along each of said guide means channels toward said terminating end until said first rail means and said second rail means fall within respective first and second rail means accepting slots, resting each of said first and second rails means on said carrier substrate.

3. The substrate connector guide as claimed in claim 2, wherein: said first rail means is a pair of guide rails mounted in tandem and extending from the bottom surface of said electrical substrate.

4. The substrate connector guide as claimed in claim 3, wherein: said second rail means is a pair of guide rails mounted in tandem and extending from the bottom surface of said electrical substrate directly opposite of said first rail means along a second major perimeter edge of said electrical substrate.

5. The substrate connector guide as claimed in claim 4, wherein: each of said first and second guide means channels is defined by a top surface and first and second drop guides positioned in tandem along said channel, said guide means first and second drop guides further defining first and second slots.

6. The substrate connector guide as claimed in claim 5, wherein: said electrical substrate and said first and second pair of guide rails are inserted within respective first and second guide means channels at respective channel open ends, and said electrical substrate is manually pushed along each respective channel with said first and second pair of guide rails riding between respective first and second guide means drop guides and top surfaces until each of said first and second pair of guide rails fall within respective first and second guide means first and second slots.

7. The substrate connector guide as claimed in claim 6, wherein: each of said guide means terminating ends is a top guide extending into respective first and second guide means channels, each top guide arranged to contact said electrical substrate when riding within each respective channel, thereby urging said electrical substrate in a downward direction.

8. A substrate connector guide for mounting and electrically connecting an electrical substrate to a carrier substrate comprising:
- rail means mounted along the major perimeter edges of said electrical substrate;
- a plurality of guide means mounted to said carrier substrate, each of said guide means including a channel extending longitudinally along a first side thereof and said channel extends between an open end to a terminating end, each channel including rail means accepting slots; and,
- said electrical substrate and said rails means arranged to be manually inserted into said guide means channel at respective channel open ends and urged along said channels toward said terminating end until said rail means fall within respective rail means accepting slots, resting said rails means on said carrier substrate.

* * * * *